July 21, 1964

J. P. STELMAK

MONOLITHIC SEMICONDUCTOR AMPLIFIER PROVIDING TWO AMPLIFIER STAGES 3,142,021

Filed Feb. 27, 1961

2 Sheets-Sheet 1

INVENTOR.
JOHN P. STELMAK
BY
Frederick Shapoe
ATTORNEY

INVENTOR.
JOHN P. STELMAK
BY
Frederick Shapoe
ATTORNEY

United States Patent Office 3,142,021

Patented July 21, 1964

3,142,021

MONOLITHIC SEMICONDUCTOR AMPLIFIER PROVIDING TWO AMPLIFIER STAGES

John P. Stelmak, Greensburg, Pa., assignor to Westinghouse Electric Corporation, East Pittsburgh, Pa., a corporation of Pennsylvania Filed Feb. 27, 1961, Ser. No. 91,841
4 Claims. (Cl. 330—39)

This invention relates to novel semiconductor devices and in particular it concerns a monolithic multifunctional semiconductor amplifier.

It is a primary object of the present invention to provide novel monolithic semiconductor structures characterized by being able to perform the functions of at least two cascaded amplifiers.

Another object of the present invention is to provide in a single semiconductor device a two-stage cascade of transistors in which the internal arrangement is such as to comprise a common emitter-common emitter functional amplifier.

Other objects of the invention will be apparent from the following discussion and description.

These and other objects are obtained in accordance with the present invention in which an intrinsic semiconductor material of a first conductivity type is provided in one of its major surfaces with a layer of an opposite conductivity type determining impurity so that the resulting layer on the body of the semiconductor material is of opposite conductivity type. Zones of that layer are scored or scribed off to provide mesa zones and lands integral with those zones. The intrinsic material physically unites the structure while providing substantial electrical isolation laterally. The interfaces between the opposite conductivity type portion of the semiconductor body at the base of the mesas and the first conductivity type intrinsic semiconductor material constitute two of the significant P-N junctions in the resulting structure; specifically they comprise the collector junctions of the two transistors. To the mesas and to the other major surface of the semiconductor, there are applied concentrations of first conductivity determining impurities, thereby defining a P-N junction in each mesa. The concentrations of conductivity determining impurities in the mesas are electrically connected to one another through a first portion of a land, associated with the first mesa, that extends between the mesas. The land associated with the second mesa serves to terminate electrodes to collector junctions as well as provide a means whereby biasing voltage is supplied to the two amplifiers in the resulting structure. The collector electrodes are formed by means provided in the other major surface of the body of the semiconductor material whereby good contact to that side of the unit results. Low resistance paths through the body of the semiconductor material join the second land to the collector electrodes. The lands also serve to provide internal resistances and impedances through which the various parts of the two transistors thus designed are joined. By appropriate external connections to take advantage of the cascading incorporated in the body of the semiconductor material, there is provided a monolithic multifunctional device in which two transistors are directly coupled in the common emitter-common emitter mode. Being a unitized and monolithic structure and performing a plurality of functions, it is evident that this is a prime example of molecular engineering and will perform a complete electronic function.

As used herein, the term "intrinsic" as applied to a body of material means that the material is relatively pure, and hence has less extrinsic semiconductivity when compared with ordinary n and p type semiconductor materials. The latter materials have typical impurity concentration of about $10^{16}$ atoms per cubic centimeter or more, materials referred to as "intrinsic" herein have an impurity concentration of about $10^{14}$ to $10^{15}$ atoms per cubic centimeter or even less. As a result of these impurities in the "intrinsic" material, even though at a low concentration, the predominant type of impurity gives to the material a slightly n or p-type characteristic (sometimes called nu and pi type material, respectively) which enables the formation of a rectifying junction by doping a portion with an impurity of type opposite to that which predominates in the "intrinsic" material. Therefore, the expression "intrinsic semiconductor material of a first conductivity type," or the like, refers to a semiconductor having a relatively low impurity concentration of which either n-type or p-type impurities predominate to some extent.

The term "mesa" as used herein refers to the shape, in elevation view, of a portion of a semiconductor body which is substantially flat topped and has abruptly sloping sides rising from a foundation of more extensive area than the flat topped portion. Hence the portion of a semiconductor body between parallel grooves not extending entirely through the body may have a "mesa" shape.

The invention will be further described in conjunction with the attached drawings, in which:

FIGURES 3 through 7 are to a considerably larger scale than that used in FIGURES 1 and 2 for purposes of visual clarity.

Figure 2:
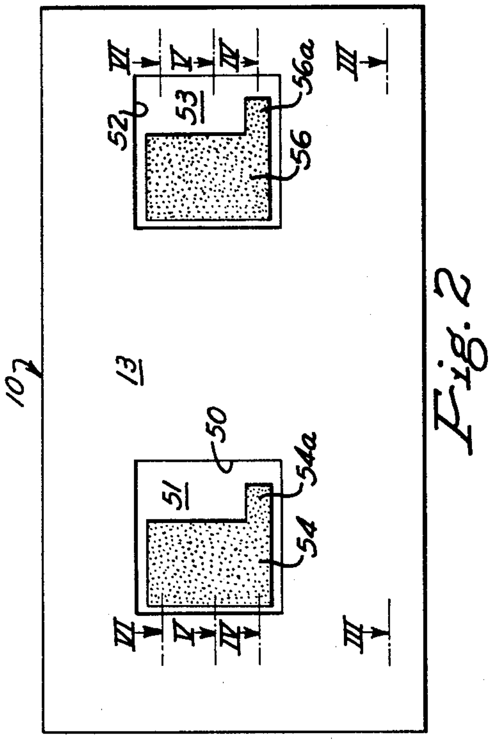
FIG. 2 is a bottom plan view of the semiconductor device of FIG. 1.
Figure 1:
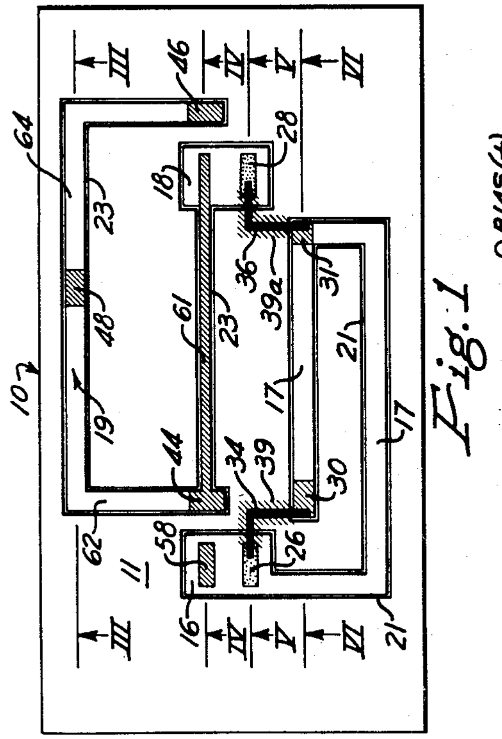
FIG. 1 is a top view of a semiconductor device in accordance with this invention.

Referring now to the drawings and particularly FIGS. 1 through 6, the numeral 10 indicates a body of semiconductor material such, for example, as a high resistivity n-type silicon single crystal wafer, having opposed major surfaces 11 and 13 at the top and bottom respectively. The semiconductor material used is essentially intrinsic, though it is of a particular conductivity type (i.e. either n or p). Successful devices have already been made with crystals having a resistivity in the range of 100 to 500 ohm-centimeters. In its upper surface 11, wafer 10 is provided with sufficient impurities of conductivity type opposite to those in the main body 10 to form a layer or zone 12 substantially throughout that surface of the wafer, the resulting layer thus being of opposite conductivity type (see FIGS. 3 to 6). While gallium is the preferred impurity for this purpose, it is apparent that other p and n-type impurities, depending on the crystal conductivity, can be used if desired.

Two mesa areas 16 and 18 are defined in layer 12. In the device, as shown, each mesa is integral with a zone or domain, hereinafter generally called a land. The first land 17 is associated with mesa 16 and extends from one side or edge of that mesa around towards the other mesa 18 and then back to, but not contacting, the first-mentioned mesa. The other land 19 is associated with mesa 18 and extends from it toward, but not touching, mesa 16 and then back around and terminating beyond mesa 18. The lands 17 and 19 and the associated mesas 16 and 18 are defined by grooves, hereinafter generally called scribe lines, that extend from the surface 11 of the body 10 of semiconductor material entirely through the layer 12 and slightly into the unmodified body 10 to insure that isolation of these zones from the layer 12 has been achieved. The scribe line 21 is that about mesa 16 and its land 17 while scribe line 23 is that about mesa 18 and its land 19.

The conductivity characteristic of layer 12 is opposite to that of the remaining part of the body 10 of semiconductor material. Consequently, the interface 12*a* defined by the lower or internal surface of layer 12 with the remainder of the semiconductor body constitutes a P-N junction. The scribe lines cut that junction, thus dividing it into a plurality of P-N junctions. Of the resulting junctions, only those that are integral with the mesas constitute significant structure with respect to the device of this invention; specifically, they constitute the collector junctions of the transistors.

Additional P-N junctions exist in each of the mesas and are made by the use of impurity concentrations of a conductivity type opposite to that used in layer 12. Thus a first concentration 26 is provided in mesa 16 and the second concentration 28 is provided in mesa 18. There thereby result, as is most clearly apparent, in FIG. 5, a first P-N junction 27 in mesa 16 and a second P-N junction 29 in mesa 18. It may be noted that contact is to be made to each of the impurity concentrations 26 and 28. Where those concentrations are provided by fusion techniques, a metal surface results. Where diffusion is practiced, subsequent application of metallic surfaces is made.

Figure 7:
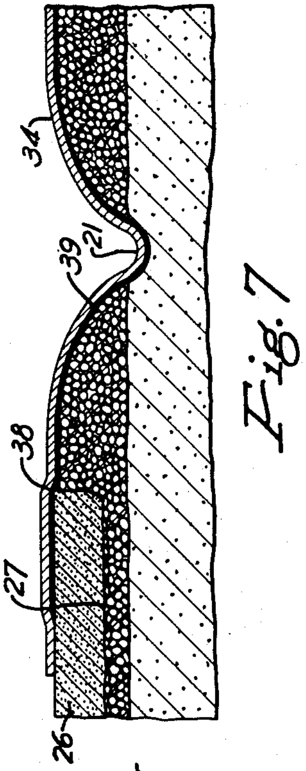
FIG. 7 is a detailed view of a scribe line and associated conductivity path.

The portion of the land 17 between the mesas constitutes a current path between them. For this purpose, an ohmic contact 30 is placed on the terminal end of land 17 adjacent mesa 16 and another ohmic contact 31 is placed on that land adjacent mesa 18. The surfaces of impurity concentrations 26 and 28 on the mesas are connected by low resistance paths 34 and 36 to the ohmic contacts 30 and 31, respectively. These low resistance paths, which are conveniently vacuum evaporated metal that is evaporated in place, are in ohmic or non-rectifying contact with their terminal areas previously provided on the conductivity concentrations 26 and 28. To avoid shorting the resulting device, the low resistance paths are underlaid with insulating layers 39 and 39*a* (see detail in FIG. 7) extending from at least the edge 38 of the conductivity concentration 26 of mesa 16 to the ohmic contact 30 in land 17 on the one hand, and from at least the edge 40 of the conductvity concentration 28 on mesa 18 to the ohmic contact 31 on land 17 on the other hand. As a practical matter, this normally can be an oxidized layer built up on the silicon surface, as by heating the crystal in air or evaporating a suitable oxide over the surface, and it extends not only between the points mentioned but also along the entire scribe line surface that is in line with the paths thus defined (see FIG. 7).

The remaining electrodes for the transistors that are made in this device are provided in the other surface, or back surface, 13 of the semiconductor body 10. As shown in FIGS. 2, 4, 5, and 6, these preferably are made by first cutting cavities 50 and 52 in the bottom major surface of semiconductor body 10. On the resulting end wall 51 and 53, respectively, of these cavities are produced the ohmic contacts 54 and 56 respectively, as by fusing n-doped metal to those end walls. Hence, low resistance ohmic contacts are defined. Of course with p-type silicon, the metal would be heavily doped p-type. Structurally, those electrodes are completed by low resistance paths through the body 10 of the semiconductor material extending on the one hand from an edge 54*a* of the electrode 54 to an ohmic contact 44 on land 19 and on the other hand from the edge 56*a* of electrode 56 to a second ohmic contact 46 on land 19. Several ways of forming such low resistance paths can be used. A special technique for such purpose is described in my copending application, Serial No. 38,051, filed June 22, 1960, and involves discharging a capacitor through probes held in contact with the terminals of the desired paths, for example, the edge 54*a* of electrode 54 and ohmic contact 44 and the edge 56*a* of electrode 56 and ohmic contact 46.

The structure of the device shown in the drawings further includes an ohmic contact 48 on land 19 intermediate ohmic contacts 44 and 46. Biasing voltage is supplied to the device through ohmic contact 48 and goes to one collector contact 44 through the portion 62 of land 19 between those two ohmic contacts, and it also goes to the other collector contact 46 through the portion 64 of land 19 between ohmic contacts 48 and 46. An addtional ohmic contact 58 is provided on mesa 16 by which the input to the transistors is supplied.

Figure 8:
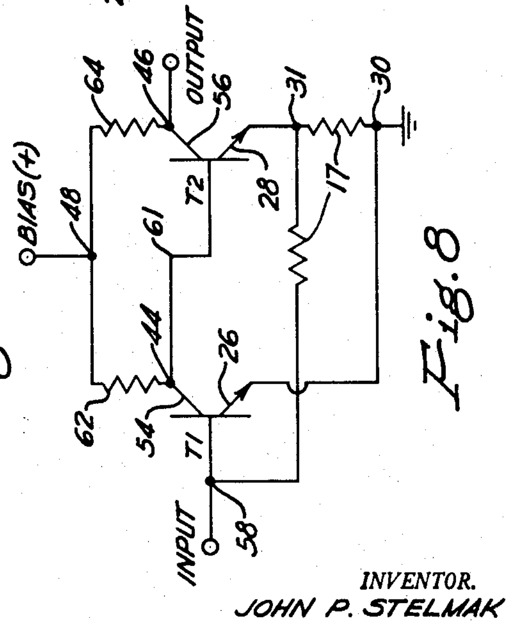
FIG. 8 is the equivalent diagram of the monolithic multifunctional device of FIGS. 1 through 6.
Figures 3, 4, 5, 6:
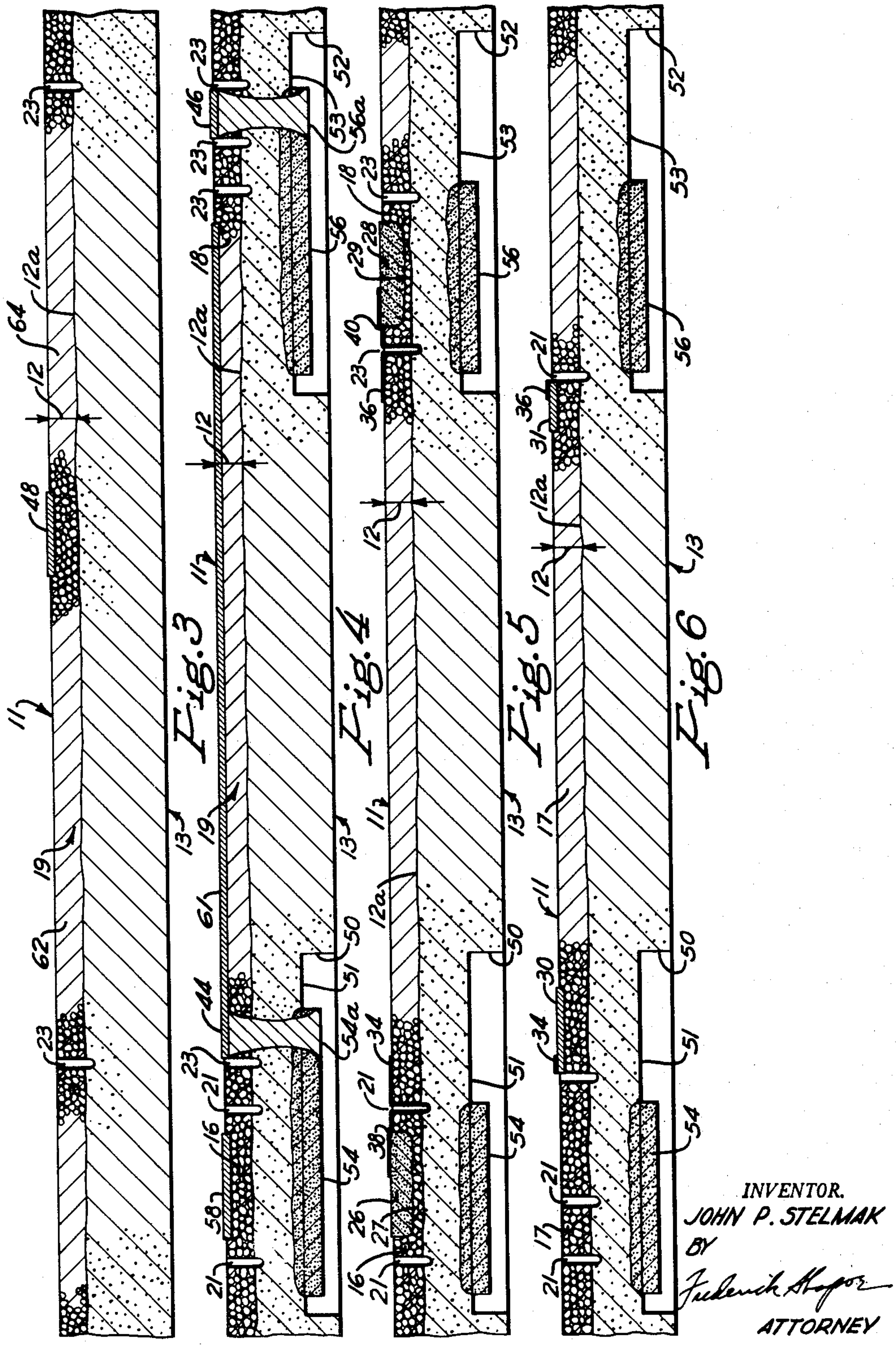
FIG. 3 is a section taken along lines III—III of the device of FIG. 1.
FIG. 4 is a section taken along lines IV—IV of FIG. 1.
FIG. 5 is a section taken along lines V—V of FIG. 1.
FIG. 6 is a section of the device of FIG. 1 taken along lines VI—VI.

From FIG. 8 it will be noted that the collector electrode of the first transistor ($T_1$) is in ohmic connection with the base electrode of the second transistor ($T_2$). For this purpose, an ohmic contact 61 is provided on the surface of land 19 from contact 44 to mesa 18. It will be appreciated, in view of ohmic contact 61, that land 19 does not need to extend from mesa 18 to contact 44; however, the device is conveniently constructed in the manner shown to simplify spacing and for similar reasons. Contacts 44, 46, 48, 58, and 61 can be readily made by fusing p-type gold to the p-type (gallium) layer 12.

Semiconductor devices as just described are of importance, in addition to their functional characteristics, in view of their ease of fabrication and the resulting reliability. For example, the size of the starting block or body of the semiconductor material need not be particularly uniform as long as each block exceeds predetermined minimum dimensions. This is largely a consequence of the provision of the various elements or functions in essentially isolated parts of the block. The separate elements are readily made by use of photoresist coating, masking, and forms through which etching, diffusion and evaportaition operations are conducted. Thus, the operations used can be performed with skills already available in the art.

The equivalent diagram and the manner of use of a common emitter-common emitter transistor as just described are evident in FIG. 8. A source of biasing voltage is connected to the device through the ohmic contact 48. This biasing voltage is led to the collector electrodes 54 and 56 through the portions 62 and 64 of land 19 from ohmic contact 48 to the ohmic contacts 44 and 46 and then through the body of semiconductor material via the low resistance paths heretofore described. The input signal enters the first transistor through the ohmic contact 58 on the mesa 16. This is amplified in the transistor associated with mesa 16 and the amplified signal is led through contact 61 to the base of the transistor associated with mesa 18. The amplified output then is taken from ohmic contact 46 on land 19. It will be noted that the output thus is taken from the collector electrode 56 and appears through ohmic contact 46 by virtue of the low resistance path described. It should also be noted from the circuit of FIG. 8 that a single power source (not shown) fed through the biasing connection 48 serves for the collector supplies of both of the transistors.

The preparation of a semiconductor device of the invention by a fusion-diffusion technique is as follows: The semiconductor body can be an n-type silicon single crystal wafer, about four mils in thickness and characterized by a 100–200 ohm centimeter resistivity and at least a 500 microsecond lifetime. Thus, it is essentially intrinsic. The crystal is provided with a p-type layer throughout its upper surface by heating the crystal for about 1½ hours in an evacuated furnace at about 1200° C. in the presence of an atmosphere of gallium generated by heating a container of gallium therein at 1000° C. Experience shows that the diffused gallium produces a layer on all surfaces of the silicon crystal about 0.4 mil in thickness. That layer along the entire bottom surface is lapped off;

the top layer remains for use in the resulting device and the side layers are permitted to remain because they do not interfere with the invention. After the bottom layer containing the gallium has been removed, cavities are cut in the resulting surface. Cavities can be provided by cutting or etching with mineral acids or other procedure. A depth that permits about 0.5 mil of silicon to remain between the cavities and the interface of the gallium layer is usually etched away. With an n-type silicon crystal, n-type foils are then fused to the end wall of the cavities, as by heating the unit with the foils in place in a furnace at about $10^{-5}$ mm. Hg at about 700° C. for 10 minutes. Preferably, antimony-containing gold foils (0.5 weight percent Sb) are used.

The ohmic contacts and mesa junctions are produced in the upper surface 11 of the device as shown in the drawings. Metal foils of n- or p-type, as necessary, are placed on contacts 58, 61, 26, 30, 31, 44, 46, 48, and 28 with all of these except 26 and 28 being p-type foils, i.e. boron doped gold. Since 26 and 28 constitute the junction electrodes and the junctions are produced by fusion, n-type foils are used. Suitable n-type foils are antimony-doped gold. The contacts just mentioned are prepared by locating the foils as desired, placing the unit in a vacuum chamber and heating it at about 700° C. for ten minutes. Thereafter, the scribe lines that serve to define and isolate the mesas and the lands on the upper surface are produced. This is accomplished by coating the surface with a photoresist coating, such as Eastman Kodak's KPR, placing a mask on the photoresist coating that defines the scribe lines as desired, exposing the resulting unit to ultraviolet light and then developing the photoresist coating. In the development step, the unexposed sections are dissolved away as by use of trichloroethylene or other suitable solvent. The scribe lines are etched into the unit with mineral acids, such as a mixture of hydrofluoric and nitric acids, with the etching continuing until channels through the gallium doped layer and slightly into the main n-type silicon are provided.

An insulation material, such as silicon oxide, is evaporated in a vacuum through a properly designed metal mask to produce an underlying coating below or under the low resistance paths 34 and 36. After this has been accomplished, the unit is again coated with a photoresist coating and using an optical mask, an aluminum or other suitable metal is evaporated in place to join the mesas conductivity concentrations 26 and 28 to their contacts 30 and 31 on the land 17. The collector electrodes on the bottom surface of the unit are then brought to the top surface by discharging a capacitor about 500 to 1000 microfarads capacity of a low voltage of but a few volts through the path from electrode 54 to contact 44, and from collector electrode 56 to contact 46. It is to be noted that this practice destroys any junction directly between the points of capacitor discharge, and the resulting path is but a few ohms (i.e. 1 to 5) in resistance. Lead wires are then attached to contacts 58, 46, and 48 for the input, output, and biasing voltage respectively, and a ground connection is made to contact 30. Any of the various known techniques for joining such leads can be used. For example, conventional thermocompression bonding is a satisfactory method. Thereafter, cleaning, resin stabilization of the surface and encapsulation in the normal manner can be used, if desired, to complete the unit for use.

Variations from the foregoing device can be made without departing from the scope of the invention. For example, for some purposes, it may not be necessary or desirable to have all of the areas by which external connection to the device is made on the same major surface. Alternatively, the resistances desired could be provided externally between the biasing source to the electrodes rather than within the body of the semiconductor as such.

The particular shape of the mesas and land areas in the amplifier described also can be varied as well as the size of the zones defining the conductivity concentrations on the means and those which serve to define the collector junctions. The size, volume length, etc., determine the electrical characteristics of the resulting device and in turn are determined by the electrical characteristics of the base material used as well as the impurity type, the actual concentration and similar considerations. The general location of these components also can be varied.

It will be noted from FIG. 8 in particular, that the lands provide significant internal resistances at various locations in the cascade of transistors. Thus, separate significant resistances exist between the biasing contact and the collector electrodes, these being the portion 61 of the land 19 between contacts 48 and 44 as well as the portion 64 between contacts 48 and 46. Another significant resistance is located between the emitter of the transistor of mesa 18 and the ground, this being the portion of land 17 between contacts 30 and 31. The other significant resistance is provided between the base electrode of the transistor of mesa 16 and the emitter of the transistor of mesa 18, this being the portion of land 17 between mesa 16 and contact 31. A particular advantage of the structure shown is that surface portions of the various lands can be etched away to vary those significant resistances in accordance with particular design considerations.

The devices of this invention also can be prepared by an all diffusion technique. This is accomplished as follows: Using the n-type silicon single crystal wafer mentioned in the preceding example as well as the conditions stated therein for comparable steps, gallium is diffused into the crystal. After the bottom surface is lapped off to remove the gallium doped layer, cavities are cut into that surface. Then phosphorus or other n-type conductivity impurity is diffused into the end walls of the cavities to form the high conductive electrode areas. After termination of this step, the crystal is exposed to heated air whereupon its entire surface is oxidized.

A photoresist coating is then applied to the top major surface. An optical mask defining the location for the conductivity concentrations on the mesas in the upper surface is applied to the photoresist coating and the unit is exposed to ultraviolet light with the mask in place. The photoresist coating is then developed, i.e. that is the defined areas are removed by trichloroethylene or other solvents and the exposed oxide etched away by an acid such as hydrofluoric acid. Then phosphorus is diffused into the exposed silicon crystal on its upper surface to produce the impurity concentration in the gallium layer whereby the emitted junctions of the transistors are produced.

With the junctions thus provided, the unit is again coated with a photoresist coating on its upper surface. A mask is applied that defines all of the scribe lines. After the photoresist has been activated and the exposed oxide removed from the lines defining the scribe lines, mineral acids are applied through the photoresist coating whereby the scribe lines are etched completely through the gallium doped layer and slightly into the n-type silicon body. Then the unit is oxidized once again whereby the scribe line channels become oxidized. A photoresist coating is again applied and developed so that all of the oxide can be removed from the contact areas 58, 61, 26, 28, 44, 46, 48, 30 and 31. An additional photoresist coating is applied and using an optical mask again, the photoresist is removed from the areas just listed as well as from 34 and 36. Aluminum or other metal is evaporated in place on the exposed areas to provide the low resistance paths and ohmic contacts. After the evaporation of the aluminum, the aluminum overlying the photoresist coating is removed along with that coating leaving ohmic contacts in place. This is accomplished with the trichloroethylene, or other solvent that attacks only the photoresist. The crystal is then turned over and a photoresist coating is applied to the bottom surface using a mask again and developing the coating to expose the phosphorus concentrations in the cavities. Then aluminum is evaporated in place on the exposed areas thereby providing ohmic contacts to them. At this point, the collector electrodes 54 and 56 are brought to their respective ohmic contacts 44 and 46 on the upper surface by discharging capacitors in the same manner as stated in the example above. The lead wires are then attached to the unit by a process such as thermocompression bonding. After the conventional cleaning, coating and encapsulation, the device is ready for use.

It will be evident from the foregoing description and discussion that devices of the invention are of wide use. In particular, however, they can be used most favorably in substitution for cascaded groups of single transistors whereby the advantage of their small size, elimination of points of failure, and high reliability can be most usefully experienced.

In accordance with the provisions of the patent statutes, the principle of the invention has been explained and there has been described what is now thought to represent its best embodiment. However, it should be understood that the invention can be practiced otherwise than as specifically disclosed.

I claim as my invention:

1. A semiconductor device comprising a body of intrinsic monocrystalline semiconductor material of a first conductivity type having opposed major surfaces, a first portion of said body extending to one of said major surfaces being of opposite conductivity type, a first zone of first conductivity type within said first portion and extending to said one major surface, a first ohmic contact to said one major surface adjacent said first zone of first conductivity type, a second zone of first conductivity type within said first portion and extending to said one major surface, said second zone being spaced from said first zone, a first mesa and an attached land in said one major surface, said mesa having included thereon said first zone and said first ohmic contact, said first land extending from adjacent said first zone to adjacent but not in contact with said second zone of first conductivity type and then back towards and terminating adjacent said first mesa, a second mesa and an attached land in said one major surface, said second mesa having included thereon said second zone of first conductivity type, said second land extending from said second mesa toward but not in contact with said first mesa and then back toward and terminating beyond said second mesa at a terminal, said first mesa and its associated first land being defined by a first scribe line and said second mesa and its associated second land being defined by a second scribe line, said scribe lines extending from said one major surface into said body of semiconductor slightly beyond the depth of said first portion thereof, a low resistance path from each of said zones of first conductivity type to said first land, said path from said second zone being in non-rectifying contact with said first land at about the center of said land, said path from said first zone being in non-rectifying contact with said first land at its terminal adjacent said first mesa, said low resistance paths being in electrical contact only with said land and the surfaces of said zones of first conductivity, two spaced low resistance contacts in said body of semiconductor material extending inwardly from said other major surface, each of said spaced contacts being essentially opposite zones of first conductivity in said one major surface, a low resistance path through said body of semiconductor material from said second land at a point adjacent said first mesa to one of said spaced contacts that is opposite said first mesa, a low resistance path through said body from said terminal of said second land to said spaced contact opposite said second mesa, an ohmic contact to said second land intermediate said locations of contact of said low resistance paths therewith, and a low resistance path ohmically joining said second mesa with said location on the second land terminating the low resistance path through the body of semiconductor material that is adjacent the first mesa.

2. A device in accordance with claim 1, said contacts on said second major surface being provided in cavities in said body extending from said second major surface, whereby the significant resistance of the collector electrodes of said transistors is controlled by the depth of said cavities and is independent of the overall thickness of said body of semiconductor material.

3. A monolithic, two stage, common emitter semiconductor amplifier comprising a block, having opposed major surfaces, of a first conductivity type monocrystalline semiconductor material having a layer thereof of opposite conductivity type extending from one major surface of said block inwardly thereby defining an interface at which conductivity type changes, a first emitter electrode comprising a conductivity determining concentration of first conductivity type impurities in a zone in the surface of said layer, a second emitter electrode comprising a second zone containing a conductivity determining concentration of first conductivity type impurities in said layer and spaced from said first zone, a first mesa and an associated land in said layer defined by a scribe line that extends from the surface of said layer through the interface, said first mesa including said first emitter electrode in it and said first land extending toward said second emitter electrode and then back toward and terminating adjacent the first mesa at a terminal point, a second mesa and a land integral therewith defined by a scribe line extending from said surface through said interface, said second mesa including said second emitter electrode in it, said scribe lines thereby defining collector junctions in said block at said interface within said mesa zones, said second land extending towards said first mesa and then back toward and terminating beyond the second mesa at a terminal point, an ohmic contact on said terminal point of the first land, a second ohmic contact on the first land adjacent the second mesa, a low resistance path in non-rectifying contact with the surface of said first emitter electrode and said first ohmic contact and a second low resistance path in non-rectifying contact with the surface of the second emitter electrode and said second ohmic contact on the first land whereby the emitter electrodes are joined to one another through a first significant resistance comprising that portion of the first land between the ohmic contacts thereon, cavities in said block of said semiconductor material from the other major surface thereof, the cavities opposing said mesa zones and terminating within said block part of the distance towards the interface, low resistance contact areas comprising collector electrodes in the cavities, an ohmic contact on the first mesa adjacent the first emitter electrode thereon, an ohmic contact on the second land adjacent the first mesa, an ohmic contact on said terminal point of the second land adjacent the second mesa, a low resistance path through the body of semiconductor material from the ohmic contact on the second land adjacent the first mesa to the collector electrode in the cavity opposite the first mesa, a low resistance path through the body of semiconductor material from the ohmic contact on the terminal point of the second land to the collector contact in the cavity opposite the second mesa, an additional ohmic contact on the second land intermediate the other two contacts thereon whereby a single source of biasing voltage is supplied to the collector electrodes of the resulting device through significant resistances, the significant resistances comprising the portions of the second land extending from the biasing voltage contact to the collector electrode ohmic contacts on the second land, and a low resistance path extending between said second mesa and the ohmic contact on the second land adjacent the first mesa.

4. A semiconductor device comprising: a body of intrinsic monocrystalline semiconductor material of a first conductivity type having opposed major surfaces; a surface layer on said body extending to one of said major surfaces being of opposite conductivity type; a first zone of first conductivity type within said surface layer and extending to said one major surface, a first ohmic contact to said one major surface adjacent said first zone of first conductivity type; a second zone of first conductivity type within said surface layer and extending to said one major surface, said second zone being spaced from said first zone; said surface layer including a first mesa and a first land in said one major surface, said mesa having included thereon said first zone and said first ohmic contact, said first land extending from said first mesa and having an elongated configuration with a terminal portion at the end thereof; said surface layer also including a second mesa in said one major surface, said second mesa having included thereon said second zone of first conductivity type, said surface layer being divided with said first mesa and its associated first land being separate from said second mesa, said intrinsic material physically uniting said first and second mesas; first and second low resistance paths each extending from one of said zones of first conductivity type to said first land, said path from said second zone being in non-rectifying contact with said first land at an intermediate point thereof, said path from said first zone being in non-rectifying contact with said first land at said terminal portion, said first and second low resistance paths being in electrical contact only with said land and the surfaces of said zones of first conductivity, two spaced low resistance contacts in said body of semiconductor material extending inwardly from said other of said major surfaces, each of said spaced contacts being opposite one of said first and second mesas in said one major surface; a third low resistance path through said body of semiconductor material from said one major surface at a point adjacent said first mesa to one of said spaced contacts that is opposite said first mesa; a fourth low resistance path through said body from said one major surface adjacent said second mesa to the one of said contacts that is opposite said second mesa; said surface layer also including a second land separate from said first mesa and said first land, said second land having an elongated configuration and first and second extremities at said points at which said third and fourth low resistance paths extend through said body from said one major surface; an ohmic contact disposed on said second land intermediate said extremities, and a fifth low resistance path on said one major surface extending from the second mesa to said third low resistance path.

References Cited in the file of this patent

UNITED STATES PATENTS

| | | |
|---|---|---|
| 2,663,806 | Darlington | Dec. 22, 1953 |
| 2,764,642 | Shockley | Sept. 25, 1956 |
| 2,820,154 | Kurshan | Jan. 14, 1958 |
| 2,954,486 | Doucette | Sept. 27, 1960 |